(12) United States Patent
Kelly et al.

(10) Patent No.: US 7,342,310 B2
(45) Date of Patent: Mar. 11, 2008

(54) MULTI-CHIP PACKAGE WITH HIGH-SPEED SERIAL COMMUNICATIONS BETWEEN SEMICONDUCTOR DIE

(75) Inventors: Michael G. Kelly, Corvallis, OR (US); Paul A. Chenard, Corvallis, OR (US); Revathi Uma Polisetti, Corvallis, OR (US); Patrick A. Mckinley, Corvallis, OR (US)

(73) Assignee: Avago Technologies General IP Pte Ltd, Singapore (SG)

( * ) Notice: Subject to any disclaimer, the term of this patent is extended or adjusted under 35 U.S.C. 154(b) by 176 days.

(21) Appl. No.: 10/841,741

(22) Filed: May 7, 2004

(65) Prior Publication Data

US 2005/0248036 A1 Nov. 10, 2005

(51) Int. Cl.
*H01L 23/34* (2006.01)
(52) U.S. Cl. .................................. 257/724; 257/723
(58) Field of Classification Search .................. 257/723, 257/724, 696, 777, 664
See application file for complete search history.

(56) References Cited

U.S. PATENT DOCUMENTS

| | | | |
|---|---|---|---|
| 5,799,208 A * | 8/1998 | Hwang et al. ................ | 710/38 |
| 6,404,648 B1 * | 6/2002 | Slupe et al. ................ | 361/760 |
| 6,472,747 B2 * | 10/2002 | Bazarjani et al. ............ | 257/724 |
| 2002/0043717 A1 | 4/2002 | Ishida et al. | |
| 2002/0122503 A1 | 9/2002 | Agazzi | |
| 2003/0042585 A1 | 3/2003 | Corisis et al. | |
| 2003/0110339 A1 | 6/2003 | Calvignac et al. | |
| 2003/0189903 A1 | 10/2003 | Hsu et al. | |
| 2003/0209740 A1 * | 11/2003 | Miyamoto et al. ........... | 257/286 |
| 2003/0229730 A1 | 12/2003 | Pedrazzini et al. | |
| 2004/0230668 A1 * | 11/2004 | Carnahan et al. ............ | 709/217 |
| 2004/0234010 A1 * | 11/2004 | Wei et al. ................... | 375/346 |
| 2005/0104183 A1 * | 5/2005 | Kuroda et al. .............. | 257/686 |
| 2005/0132111 A1 * | 6/2005 | Bar-Or ....................... | 710/106 |
| 2005/0146008 A1 * | 7/2005 | Miyamoto et al. ........... | 257/686 |
| 2006/0131430 A1 * | 6/2006 | Ito ............................... | 235/492 |
| 2006/0237835 A1 * | 10/2006 | Fujita et al. ................ | 257/691 |
| 2006/0255445 A1 * | 11/2006 | Lee ............................. | 257/686 |

FOREIGN PATENT DOCUMENTS

WO   WO 00/02134   1/2000

OTHER PUBLICATIONS

Jason Cong, University of California—Los Angeles; report entitled "Final Report: NSF/NSC International Workshop on Challenges and Opportunities in Giga-Scale Integration for System-On-A-Chip"; 18 pgs; 1999.
Computer Graphics World webpage providing article by Dr. Y. Tanurhan entitled "Evolving to Embedded Programmable-Logic Cores for SoCs"; 7 pgs; (C) 2001.
Jag Bolaria et al., publication excerpt entitled "A Guide High-Speed Interconnects, First Edition", 18 pgs; Oct. 2003.
Mouser Electronics webpage including an article by Valerie Rachko entitled "Programmable System-on-Chip Devices Take Innovation to the Next Level"; 2 pgs; (C) 2004.

* cited by examiner

Primary Examiner—Sheila V. Clark

(57) ABSTRACT

A multi-chip package includes a package substrate. First and second semiconductor die are formed on the package substrate. The first and the second semiconductor die are configured to communicate with each other via a high-speed serial communications protocol.

13 Claims, 3 Drawing Sheets

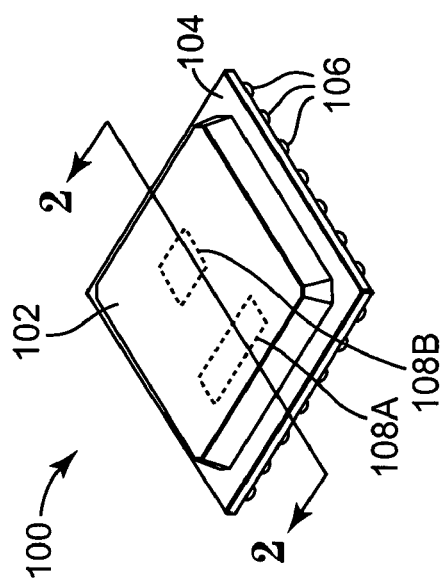
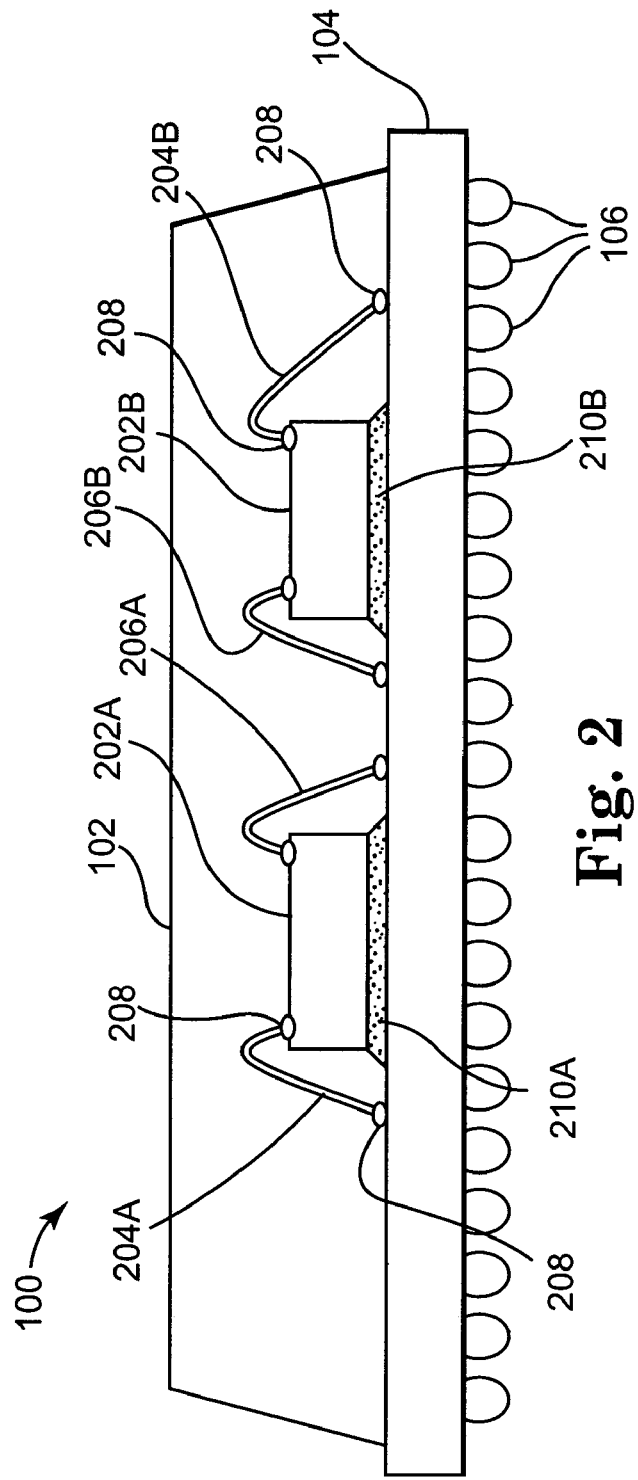

MULTI-CHIP PACKAGE WITH HIGH-SPEED SERIAL COMMUNICATIONS BETWEEN SEMICONDUCTOR DIE

THE FIELD OF THE INVENTION

This invention relates generally to semiconductor devices, and relates more particularly to a multi-chip package with high-speed serial communications between semiconductor die.

BACKGROUND OF THE INVENTION

The current trend in chip integration, such as for system-on-a-chip (SOC) applications, is to include all of the blocks (e.g., processor, memory, phase-locked loops (PLL's), input/output blocks, etc.) in a single chip. However, with the increasing complexity of the blocks being integrated, it is becoming more difficult to integrate all of the blocks into a single chip, and to perform testing and verification. In addition, as the blocks in these chips become larger and more complex, the number of signal lines and interconnection structures (e.g., bond wires) is increasing, which can cause a routing congestion problem. The interconnection structures are also becoming longer and operate at higher speeds, which increases power consumption.

The processors in SOC applications are becoming faster and faster. However, not all of the blocks in SOC chips are high performance blocks like the processor. By increasing the speed of the processor, there is typically a cost penalty for the entire integrated chip because not all of the blocks need that same performance. The cost is increased because all of the blocks in the chip are typically optimized around the speed and performance requirements of the processor.

Multi-chip (i.e., multi-die) packages have been developed that include multiple semiconductor die in a single package. However, conventional multi-chip packages typically include a large number of signal lines between the chips, and these packages typically suffer from the same routing congestion and other problems described above with respect to single-chip packages.

SUMMARY OF THE INVENTION

One form of the present invention provides a multi-chip package. The multi-chip package includes a package substrate. First and second semiconductor die are formed on the package substrate. The first and the second semiconductor die are configured to communicate with each other via a high-speed serial communications protocol.

BRIEF DESCRIPTION OF THE DRAWINGS

FIG. 1 is a diagram illustrating a perspective view of a multi-chip package according to one embodiment of the present invention.

FIG. 2 is a diagram illustrating a cross-sectional view of the multi-chip package shown in FIG. 1 viewed from section lines 2-2 according to one embodiment of the present invention.

DESCRIPTION OF THE PREFERRED EMBODIMENTS

Figure 3:
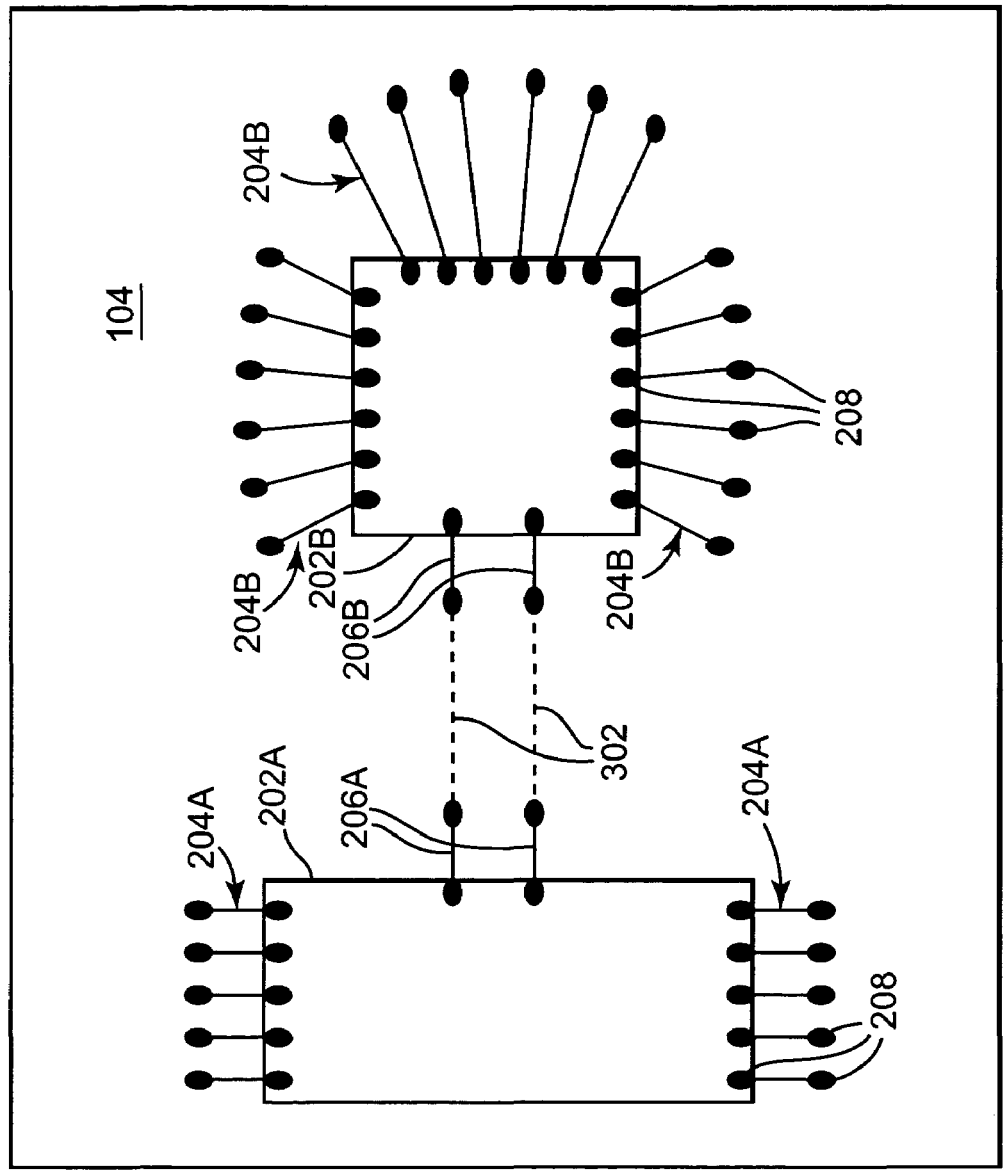
FIG. 3 is a diagram illustrating a top view of the multi-chip package shown in FIG. 1 according to one embodiment of the present invention.

In the following detailed description of the preferred embodiments, reference is made to the accompanying drawings, which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 is a diagram illustrating a perspective view of a multi-chip package 100 according to one embodiment of the present invention. Multi-chip package 100 is also referred to as semiconductor device 100. Multi-chip package 100 includes encapsulation layer 102, substrate 104, and a plurality of external interconnection structures 106. Encapsulation layer 102 is formed on a top surface of substrate 104, and protects semiconductor die within package 100 from external contamination. In one embodiment, two semiconductor die are included within package 100, with positions that are identified by hidden lines 108A and 108B in FIG. 1. The plurality of external interconnection structures 106 are formed on a bottom surface of substrate 104, and provide a mechanism for mechanically and electrically connecting package 100 to a printed circuit board (PCB) or other device. In one embodiment, the interconnection structures 106 are solder balls that are configured in a ball grid array (BGA). In one form of the invention, package 100 is a plastic ball grid array (PBGA).

FIG. 2 is a diagram illustrating a cross-sectional view of the multi-chip package 100 shown in FIG. 1 viewed from section lines 2-2 according to one embodiment of the present invention. Multi-chip package 100 includes encapsulation layer 102, semiconductor die 202A and 202B, internal interconnection structures 204A, 204B, 206A, and 206B, die attach epoxy layers 210A and 210B, substrate 104, and external interconnection structures 106. Semiconductor die 202A and 202B are also referred to as integrated circuits, or semiconductor chips, or chips. Semiconductor die 202A is attached to a top surface of substrate 104 via die attach epoxy layer 210A, and semiconductor die 202B is attached to a top surface of substrate 104 via die attach epoxy layer 210B. The positions of semiconductor die 202A and 202B in package 100 according to one embodiment of the invention are identified in FIG. 1 by hidden lines 108A and 108B, respectively. Internal interconnection structures 204A and 206A electrically connect die 202A to substrate 104, and internal interconnection structures 204B and 206B electrically connect die 202B to substrate 104. In one embodiment, interconnection structures 204A, 204B, 206A, and 206B are bond wires, and are also referred to herein as bond wires 204A, 204B, 206A, and 206B. In another embodiment, multi-chip package 100 is implemented in a flip-chip configuration.

Metal pads 208 are formed on a top surface of die 202A and 202B, and are also formed on a top surface of substrate 104. The metal pads 208 on the die 202A and 202B are bonded to the metal pads 208 on the substrate 104 via bond wires 204A, 204B, 206A, and 206B.

FIG. 3 is a diagram illustrating a top view of the multi-chip package 100 shown in FIG. 1 with the encapsulation layer 102 removed according to one embodiment of the present invention. As shown in FIG. 3, a plurality of metal pads 208 are formed on a top surface of die 202A and 202B, substantially near the edges of the die 202A and 202B. Metal pads 208 are also formed on a top surface of substrate 104. In one embodiment, the metals pads 208 on the die 202A and 202B include power die pads, ground die pads, and signal die pads. The power die pads are connected to power supply connections within the die 202A and 202B, the ground die pads are connected to ground connections within the die 202A and 202B, and the signal die pads are connected to various circuits within the die 202A and 202B. In one embodiment, a subset of the signal die pads are used for inter-chip communications (i.e., communications between die 202A and die 202B), and are referred to herein as inter-chip communications die pads.

In one form of the invention, for die 202A, the power die pads, ground die pads, and the signal die pads that are not used for inter-chip communications are connected to pads 208 on the substrate 104 via the set of interconnection structures 204A. In the illustrated embodiment, the set of interconnection structures 204A includes ten interconnection structures (e.g., bond wires). In one embodiment, for die 202B, the power die pads, ground die pads, and the signal die pads that are not used for inter-chip communications are connected to pads 208 on the substrate 104 via the set of interconnection structures 204B. In the illustrated embodiment, the set of interconnection structures 204B includes eighteen interconnection structures (e.g., bond wires).

To simplify the illustration, only ten interconnection structures 204A and eighteen interconnection structures 204B are shown in FIG. 3. In an actual implementation according to one embodiment, many more die pads and interconnection structures 204A and 204B are used for power connections, ground connections, and non-inter-chip communications signals.

In one embodiment, the signal die pads that are used for inter-chip communications for die 202A are connected to pads 208 on the substrate 104 via the set of interconnection structures 206A. In the illustrated embodiment, the set of interconnection structures 206A includes two interconnection structures (e.g., bond wires). In one embodiment, the signal die pads that are used for inter-chip communications for die 202B are connected to pads 208 on the substrate 104 via the set of interconnection structures 206B. In the illustrated embodiment, the set of interconnection structures 206B includes two interconnection structures (e.g., bond wires).

In one form of the invention, substrate 104 is a multi-layer substrate that includes conductive traces coupled to pads 208 on the substrate 104, and that includes vias (not shown) for routing signals between the multiple layers of the substrate 104, and to external interconnection structures 106 (FIGS. 1 and 2). As shown in FIG. 3, a set of two traces 302 (shown with hidden lines) in substrate 104 connects the set of two interconnection structures 206A of semiconductor die 202A to the set of two interconnection structures 206B of semiconductor die 202B. To simplify the illustration, traces for the interconnection structures 204A and 204B are not shown in FIG. 3.

As mentioned above, the interconnection structures 206A are coupled to the signal die pads of die 202A that are used for inter-chip communications, and the interconnection structures 206B are coupled to the signal die pads of die 202B that are used for inter-chip communications. In one form of the invention, all communications or substantially all communications between die 202A and die 202B are accomplished through interconnection structures 206A, traces 302, and interconnection structures 206B, and the communications are high-speed serial communications. In one embodiment, die 202A and die 202B each include high-speed serial input/output interface circuitry coupled to interconnection structures 206A and 206B, respectively, for sending and receiving high-speed serial communications, as described in further detail below with reference to FIGS. 4A-4C.

Figure 4A:
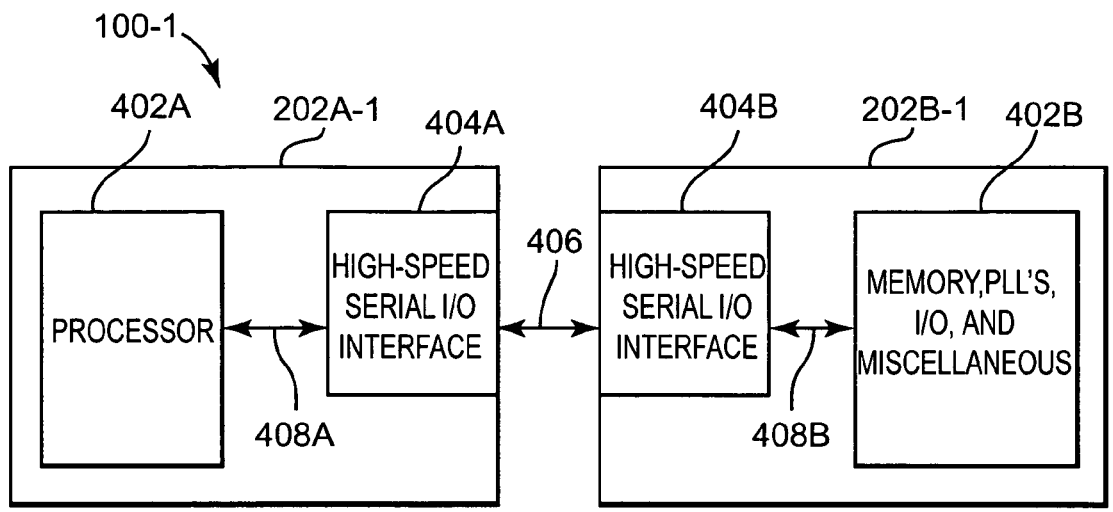
FIGS. 4A-4C are block diagrams illustrating components of the semiconductor die of the multi-chip package shown in FIGS. 1-3 according to embodiments of the present invention.
Figure 4B:
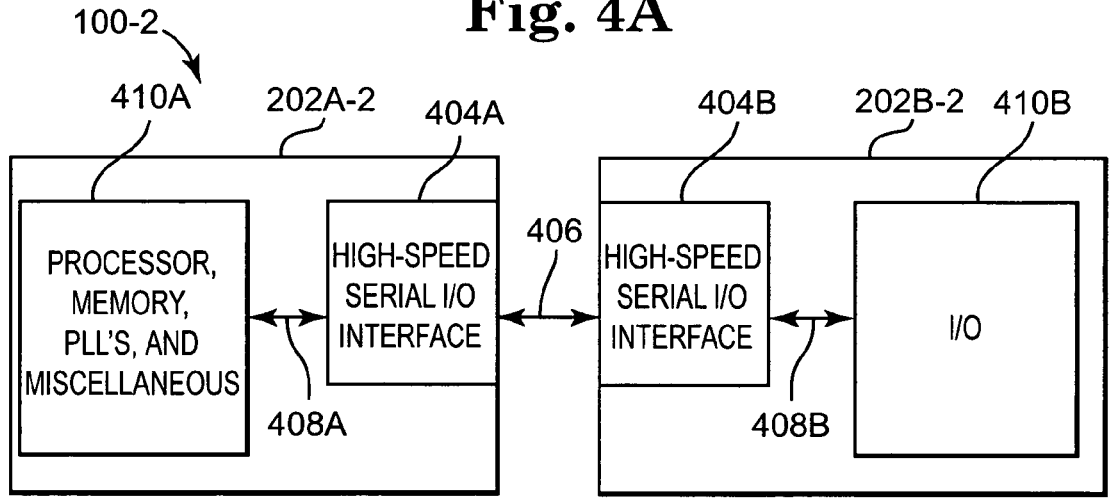
Figure 4C:
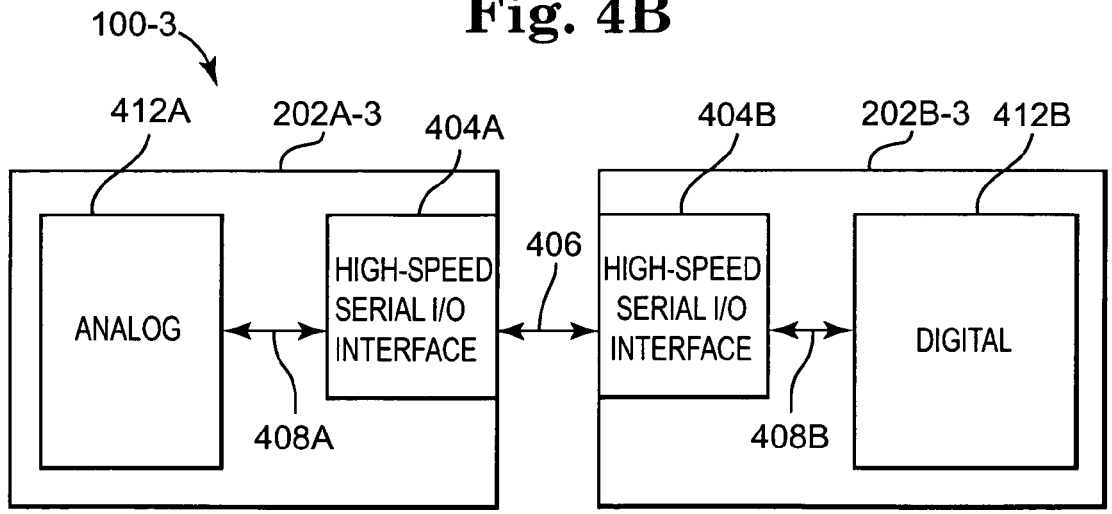

FIGS. 4A-4C are block diagrams illustrating components of the semiconductor die 202A and 202B of the multi-chip package 100 shown in FIGS. 1-3 according to embodiments of the present invention. FIGS. 4A-4C illustrate three embodiments of the multi-chip package 100, which are identified by reference numbers 100-1, 100-2, and 100-3, respectively. Similarly, the embodiments of semiconductor die 202A and 202B in FIGS. 4A-4C are identified by reference numbers 202A-1 and 202B-1; 202A-2 and 202B-2; and 202A-3 and 202B-3, respectively.

As shown in FIG. 4A, multi-chip package 100-1 includes semiconductor die 202A-1 and 202B-1. Semiconductor die 202A-1 includes processor circuitry 402A, and high-speed serial input/output (I/O) interface circuitry 404A. Processor circuitry 402A and interface circuitry 404A are communicatively coupled together via communication link 408A. Semiconductor die 202B-1 includes memory, phase-lock loop (PLL), input/output, and miscellaneous circuitry 402B, and high-speed serial input/output interface circuitry 404B. Circuitry 402B and interface circuitry 404B are communicatively coupled together via communication link 408B. Interface circuitry 404A in die 202A-1 and interface circuitry 404B in die 202B-1 are communicatively coupled together via communication link 406. In one embodiment, communication link 406 is implemented with interconnection structures 206A and 206B and corresponding metal pads 208, and traces 302, as shown in FIG. 3. In one embodiment, all or substantially all communications between die 202A-1 and 202B-1 (i.e., inter-chip communications) occur over communication link 406.

In one embodiment, die 202A-1 and die 202B-1 are configured to communicate with each other via interfaces 404A and 404B using a high-speed serial communications protocol. In one embodiment, interfaces 404A and 404B are each configured to communicate at a rate of 1 gigabits per second (Gbps) or greater. In another form of the invention, interfaces 404A and 404B are each configured to communicate at a rate of 10 Gbps or greater. In one form of the invention, interfaces 404A and 404B are each configured to communicate based on a high-speed serial communication protocol, such as SerDes (Serializer De-serializer), Hyper-Transport, RapidIO, PCI Express, Infiniband, SPI 4.2, or another high-speed serial protocol.

In one embodiment, multi-chip package 100-1 includes components that are commonly found in conventional system-on-a-chip (SOC) integrated circuits, such as a processor, memory, phase-locked loops, input/output, and logic, but the system is implemented with two semiconductor die 202A-1 and 202B-1, rather than one. And the two semiconductor die 202A-1 and 202B-1 communicate with each other inside the package using high-speed serial communications. In the embodiment illustrated in FIG. 4A, the processor circuitry 402A is separated out from the rest of the system circuitry 402B, and the two sets of circuitry 402A and 402B are implemented in separate semiconductor die 202A-1 and 202B-1, respectively.

As mentioned above in the Background of the Invention section, there is typically a cost penalty associated with existing SOC chips, because all of the blocks in the chip are typically optimized around the speed and performance requirements of the processor, even though some of the blocks may not need to have the same performance as the processor. By separating the SOC functionality into two semiconductor die 202A-1 and 202B-1, the processor 402A can be optimized around its speed and performance requirements, and the other circuitry 402B of the system can be optimized around its speed and performance requirements. In one embodiment, the two semiconductor die 202A-1 and 202B-1 are fabricated using two different silicon process technologies. In one form of the invention, semiconductor die 202A-1, which includes processor circuitry 402A, is fabricated using a current state-of-the-art silicon process technology, and semiconductor die 202B-1 is fabricated using an older and less expensive silicon process technology.

FIG. 4B shows multi-chip package 100-2, which includes semiconductor die 202A-2 and 202B-2. Semiconductor die 202A-2 includes processor, memory, phase-lock loop (PLL), and miscellaneous circuitry 410A, and high-speed serial input/output interface circuitry 404A. Circuitry 410A and interface circuitry 404A are communicatively coupled together via communication link 408A. Semiconductor die 202B-2 includes input/output circuitry 410B, and high-speed serial input/output interface circuitry 404B. Input/output circuitry 410B and interface circuitry 404B are communicatively coupled together via communication link 408B. Interface circuitry 404A in die 202A-2 and interface circuitry 404B in die 202B-2 are communicatively coupled together via communication link 406. In one embodiment, communication link 406 is implemented with interconnection structures 206A and 206B and corresponding metal pads 208, and traces 302, as shown in FIG. 3.

In one embodiment, input/output circuitry 410B includes at least one conventional input/output interface, such as USB, Firewire, SPI 4.2, PCI-X, and/or other types of input/output interfaces. In another embodiment, input/output circuitry 410B includes a plurality of different types of conventional input/output interfaces. In one form of the invention, all or substantially all communications between package 100-2 and devices external to package 100-2 (i.e., off-chip or external communications) are handled by input/output circuitry 410B. In one embodiment, input/output circuitry 410B is connected to a sub-set of the interconnection structures 204B (FIG. 3), and communicates with external devices via interconnection structures 106 (FIGS. 1 and 2).

With existing chips, if a change in the input/output circuitry of the chip is desired, a whole new mask set must typically be created, which can be complex and expensive. In contrast, by separating the SOC functionality into two semiconductor die 202A-2 and 202B-2, with the input/output circuitry 410B in its own connectivity die 202B-2, the input/output functionality of the system can be changed relatively easily by using a different connectivity die 202B-2 in the package 100-2. In one form of the invention, die 202A-2 is implemented using programmable gate technology, which allows additional digital functionality to be added without spinning the connectivity die 202B-2. And a family of different connectivity die 202B-2 can be generated over time with different combinations of standard input/output features, which results in a product that can last through more product generations, without generating whole new mask sets. In addition, because of the separation of the SOC functionality, revisions to the semiconductor die 202A-2 can be made without requiring a new implementation of the connectivity die 202B-2.

In one embodiment, the two semiconductor die 202A-2 and 202B-2 are fabricated using two different silicon process technologies. In one form of the invention, semiconductor die 202A-2 is fabricated using a current state-of-the-art silicon process technology, and semiconductor die 202B-2 is fabricated using an older and less expensive silicon process technology. An advantage of using two different process technologies is that the older chip technology has a proven design that can be reused with the new functionality of the second chip.

FIG. 4C shows multi-chip package 100-3, which includes semiconductor die 202A-3 and 202B-3. Semiconductor die 202A-3 includes analog circuitry 412A, and high-speed serial input/output interface circuitry 404A. Analog circuitry 412A and interface circuitry 404A are communicatively coupled together via communication link 408A. Semiconductor die 202B-3 includes digital circuitry 412B, and high-speed serial input/output interface circuitry 404B. Digital circuitry 412B and interface circuitry 404B are communicatively coupled together via communication link 408B. Interface circuitry 404A in die 202A-3 and interface circuitry 404B in die 202B-3 are communicatively coupled together via communication link 406. In one embodiment, communication link 406 is implemented with interconnection structures 206A and 206B and corresponding metal pads 208, and traces 302, as shown in FIG. 3. By separating the analog and digital circuitry of a system into two semiconductor die 202A-3 and 202B-3 as shown in FIG. 4C, the two sets of circuitry can be individually optimized around their own speed and performance requirements. In one embodiment, multi-chip package 100-3 is a computing system with all or substantially all of the analog circuitry 412A of the system implemented in die 202A-3, and all or substantially all of the digital circuitry 412B implemented in die 202B-3.

Although the multi-chip package 100 according to one embodiment of the invention is implemented in a side-by-side configuration, wherein the semiconductor die 202A and 202B are positioned beside each other on the substrate 104, in other embodiments, the multi-chip package 100 is implemented in other configurations, such as in a stacked die configuration. In further embodiments, more than two semiconductor die are included in multi-chip package 100.

The multi-chip package 100 according to embodiments of the present invention provides numerous advantages over existing single chip packages. One form of the invention provides high-speed low pin count connectivity between the semiconductor die 202A and 202B in a common package. One form of the multi-chip package 100 provides a reduced number of interconnection structures (e.g., bond wires) by using high-speed serial input/output interfaces that use a small number (e.g., 2 or 4) of interconnection structures for inter-chip communications. The smaller number of interconnection structures helps to alleviate the routing congestion that is typically a problem for existing single-chip implementations, and shorter interconnection structures can be used, which helps to alleviate the power consumption problem associated with longer interconnection structures. In addition, using a smaller number of interconnection structures reduces the cost of the package, and can also substantially reduce the die size for pad-limited designs. Furthermore, by using two chips, rather than a single chip as in conventional SOC chips, testing becomes easier to perform. And the ability to spin the two chip designs separately allows chip designs to be reused.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A multi-chip package comprising:
a package substrate;
a first semiconductor die disposed on the package substrate comprising a first processor having a first set of speed and performance criteria associated therewith, the first semiconductor die further comprising first electronic circuitry in addition to the first processor; and
a second semiconductor die disposed on the package substrate comprising a second processor having a second set of performance and speed criteria associated therewith, the first set of criteria being different from the second set of criteria, the second semiconductor die further comprising second electronic circuitry in addition to the second processor;
wherein the first and the second semiconductor dice are communicatively coupled together by three or less communication links disposed on or within the multi-chip package, the first and second die being configured to communicate with one another by means of a high-speed serial communications protocol, the first processor and first electronic circuitry being optimized for performance in respect of the first set of criteria, the second processor and second electronic circuitry being optimized for performance in respect of the second set of criteria, wherein all communications between the first and the second semiconductor dice occur over the three or less communication links.

2. The multi-chip package of claim 1, and further comprising a plurality of interconnection structures formed on a bottom surface of the package substrate.

3. The multi-chip package of claim 2, wherein the interconnection structures are solder balls.

4. The multi-chip package of claim 1, further comprising a plurality of interconnection structures for interconnecting the first and the second semiconductor dice to the package substrate.

5. The multi-chip package of claim 4, wherein the interconnection structures comprise bond wires.

6. The multi-chip package of claim 1, wherein the package substrate includes a set of conductive traces for carrying high speed serial communications between the first and the second semiconductor dice.

7. The multi-chip package of claim 1, wherein the first and the second semiconductor dice are configured to communicate with each other via the high-speed serial communications protocol at a rate of at least one gigabits per second (Gbps).

8. The multi-chip package of claim 1, wherein the first and the second semiconductor dice are configured to communicate with one another by means of the high-speed serial communications protocol at a rate of at least ten gigabits per second (Gbps).

9. The multi-chip package of claim 1, wherein the first semiconductor further comprises at least one of a memory, phase-locked loop circuitry, input/output circuitry, and topic circuitry.

10. The multi-chip package of claim 1, wherein second semiconductor die further comprises at least one of a memory, phase-locked loop circuitry, input/output circuitry, and logic circuitry.

11. The multi-chip package of claim 1, wherein the multi-chip package is configured in at least one of a stacked die configuration and a flip-chip configuration.

12. The multi-chip package of claim 1, wherein the multi-chip package is a computing system, and wherein the first semiconductor die includes circuitry formed by a first silicon processing technology, the second semiconductor die includes circuitry formed by a second silicon processing technology, and wherein the first processing technology is different than the second processing technology.

13. The multi-chip package of claim 1, further comprising input/output circuitry configured to manage communications between the multi-chip package and devices external thereto.

* * * * *

UNITED STATES PATENT AND TRADEMARK OFFICE
CERTIFICATE OF CORRECTION

| | | |
|---|---|---|
| PATENT NO. | : 7,342,310 B2 | Page 1 of 1 |
| APPLICATION NO. | : 10/841741 | |
| DATED | : March 11, 2008 | |
| INVENTOR(S) | : Michael G. Kelly et al. | |

It is certified that error appears in the above-identified patent and that said Letters Patent is hereby corrected as shown below:

Column 8, Line 22, Claim 9, delete "topic" and insert -- logic --;

Column 8, Line 24, Claim 10, delete "wherein second" and insert -- wherein the second --.

Signed and Sealed this

Eighth Day of June, 2010

David J. Kappos
*Director of the United States Patent and Trademark Office*